United States Patent
Egami et al.

(10) Patent No.: US 11,613,683 B2
(45) Date of Patent: Mar. 28, 2023

(54) METHOD FOR PRODUCING CHAIN-LIKE PARTICLE DISPERSION, AND DISPERSION OF CHAIN-LIKE PARTICLES

(71) Applicant: JGC CATALYSTS AND CHEMICALS LTD., Kanagawa (JP)

(72) Inventors: Miki Egami, Kitakyushu (JP); Masanobu Taniguchi, Kitakyushu (JP); Mitsuaki Kumazawa, Kitakyushu (JP); Ryo Muraguchi, Kitakyushu (JP)

(73) Assignee: JGC CATALYSTS AND CHEMICALS LTD., Kanagawa (JP)

( * ) Notice: Subject to any disclaimer, the term of this patent is extended or adjusted under 35 U.S.C. 154(b) by 0 days.

(21) Appl. No.: 16/955,290

(22) PCT Filed: Dec. 27, 2018

(86) PCT No.: PCT/JP2018/048128
§ 371 (c)(1),
(2) Date: Jun. 18, 2020

(87) PCT Pub. No.: WO2019/131874
PCT Pub. Date: Jul. 4, 2019

(65) Prior Publication Data
US 2020/0392385 A1 Dec. 17, 2020

(30) Foreign Application Priority Data
Dec. 27, 2017 (JP) .............. JP2017-251910

(51) Int. Cl.
*C09K 3/14* (2006.01)
*C01B 33/18* (2006.01)
(Continued)

(52) U.S. Cl.
CPC .......... *C09K 3/1409* (2013.01); *B24B 37/042* (2013.01); *C01B 33/18* (2013.01);
(Continued)

(58) Field of Classification Search
CPC ..... B24B 37/00; B24B 37/042; C01B 33/146; C01B 33/18; C01P 2004/62;
(Continued)

(56) References Cited

U.S. PATENT DOCUMENTS

| 6,083,314 A | 7/2000 | Nakashima et al. |
| 2005/0116205 A1* | 6/2005 | Muraguchi ........... C01B 33/146 252/500 |

(Continued)

FOREIGN PATENT DOCUMENTS

| CN | 1626584 A | 6/2005 |
| JP | H11-061043 A | 3/1999 |

(Continued)

OTHER PUBLICATIONS

International Search Report dated Feb. 26, 2019 filed in PCT/JP2018/048128.

(Continued)

*Primary Examiner* — Shuangyi Abu Ali
(74) *Attorney, Agent, or Firm* — Pearne & Gordon LLP

(57) ABSTRACT

There is provided a production method of a chain silica particle dispersion. This production method includes a dispersion preparation step of hydrolyzing alkoxysilane in the presence of ammonia to prepare a silica particle dispersion, an ammonia removal step of removing the ammonia from the silica particle dispersion such that an ammonia amount relative to silica contained in the silica particle dispersion is 0.3% by mass or less, and a hydrothermal treatment step of hydrothermally treating the silica particle dispersion having a silica concentration of 12% by mass or more, from which the ammonia has been removed, at a temperature of not lower than 150° C. and lower than 250° C. An abrasive including such chain silica particles is high in polishing rate and excellent in polishing properties.

5 Claims, 1 Drawing Sheet

(51) Int. Cl.
*B24B 37/04* (2012.01)
*H01L 21/321* (2006.01)
*H01L 21/768* (2006.01)

(52) U.S. Cl.
CPC ...... *C01P 2004/62* (2013.01); *C01P 2004/64* (2013.01); *H01L 21/3212* (2013.01); *H01L 21/7684* (2013.01)

(58) Field of Classification Search
CPC ............... C01P 2004/64; C09K 3/1409; H01L 21/3212; H01L 21/7684
See application file for complete search history.

(56) References Cited

U.S. PATENT DOCUMENTS

| | | | |
|---|---|---|---|
| 2010/0146864 | A1 | 6/2010 | Nakayama et al. |
| 2012/0103231 | A1* | 5/2012 | Ishihara ............... C09D 179/04 106/287.11 |

FOREIGN PATENT DOCUMENTS

| | | | |
|---|---|---|---|
| JP | 2003-133267 A | | 5/2003 |
| JP | 2005-186435 A | | 7/2005 |
| JP | 2013-032276 A | | 2/2013 |
| JP | 2014798649 A1 | * | 10/2014 |
| JP | 2015-029965 A | | 2/2015 |

OTHER PUBLICATIONS

Taiwanese Office Action dated Apr. 27, 2022, for the corresponding Taiwanese Patent Application No. 107147236.

\* cited by examiner

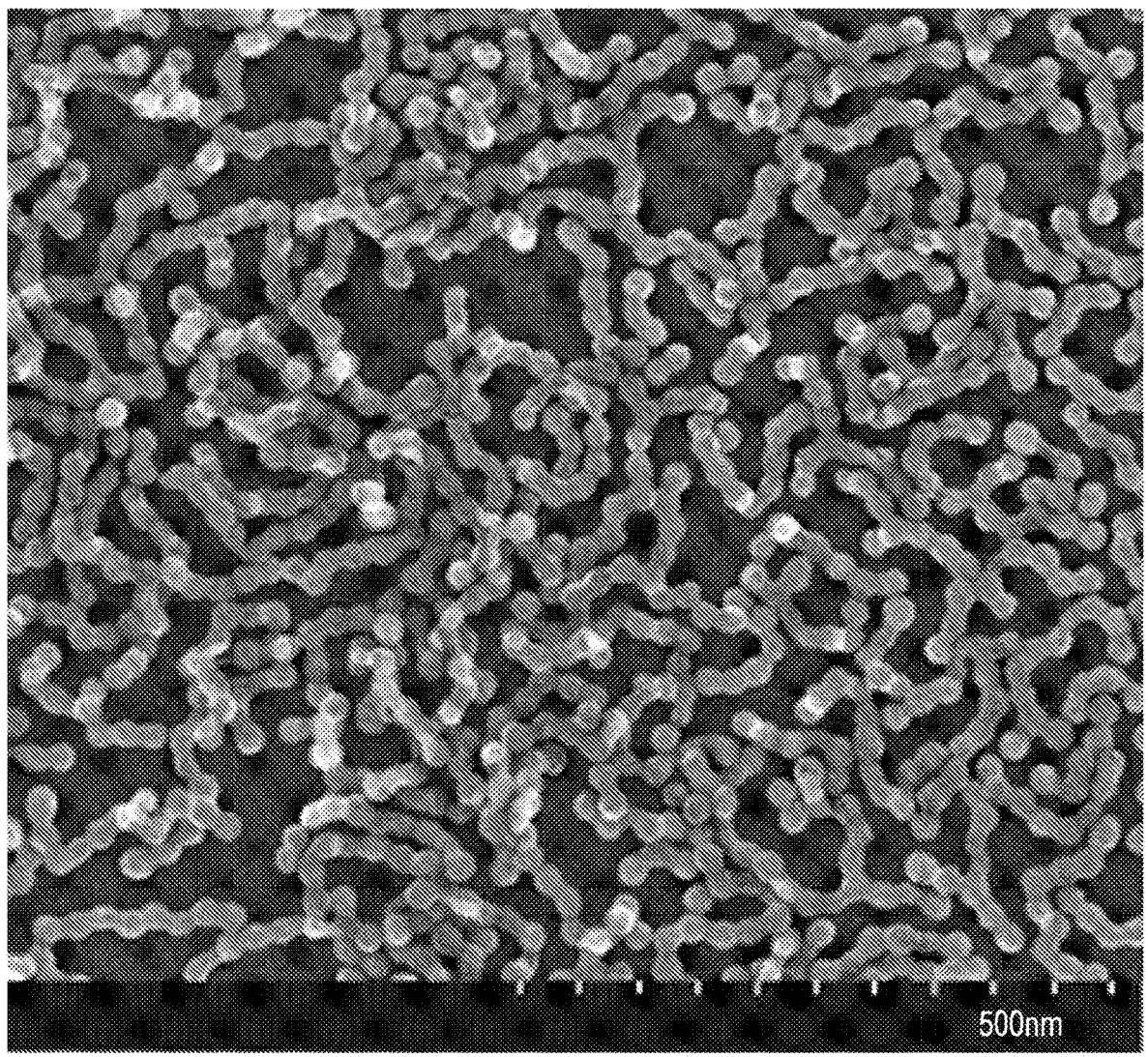

METHOD FOR PRODUCING CHAIN-LIKE PARTICLE DISPERSION, AND DISPERSION OF CHAIN-LIKE PARTICLES

TECHNICAL FIELD

This relates to a dispersion of chain particles and a production method of the dispersion. The dispersion of chain particles formed with silica particles as primary particles is useful as an abrasive in, for example, forming a substrate of a metal wiring layer of a semiconductor integrated circuit.

BACKGROUND ART

Various integrated circuits are used in electronic equipment such as computers. As electronic equipment decreases in size and increases in performance, such circuits are required to increase in density and performance.

For example, in a semiconductor integrated circuit, an inter-wiring layer film (insulating film) is formed on a substrate such as a silicon wafer. On the inter-wiring layer film, a groove for metal wiring is formed by patterning. Furthermore, a barrier metal layer such as tantalum nitride (TaN) is formed on the groove as necessary by a sputtering method or the like. Next, copper for metal wiring is film-formed by a chemical vapor deposition (CVD) method or the like. When the barrier metal layer is disposed, a decrease in insulation associated with the diffusion and erosion of the copper, impurities, or the like into the interlayer insulating film can be prevented, and adhesiveness between the interlayer insulating film and the copper can be enhanced.

Next, an unnecessary copper film and barrier metal film (sometimes referred to as a sacrifice layer) formed outside the groove are removed by polishing through a chemical mechanical polishing (CMP) method, and at the same time, the upper surface is planarized as much as possible. Accordingly, the metal film remains only in the groove to form a copper wiring and circuit pattern.

Known silica particles used as an abrasive used in this CMP method are spherical or irregular. Irregular silica particles are suitably used as an abrasive required to have a certain polishing rate.

As a production method of such irregular silica particles, the following method has been proposed. Firstly, a catalyst is added to a mixed solution containing water, an organic solvent, and alkoxysilane for performing a hydrolysis reaction of alkoxysilane. Accordingly, silica fine particles having a particle size of 10 to 30 nm were generated. Thereafter, an unreacted alkoxysilane, organic solvent, and catalyst were removed from the mixed solution after the reaction to prepare an aqueous dispersion of silica fine particles. This aqueous dispersion is adjusted such that the solid content concentration of the silica fine particles in the aqueous dispersion is 0.1 to 5% by mass, and the ammonia concentration is 50 to 400 ppm. Thereafter, this aqueous dispersion is hydrothermally treated at a temperature of 250° C. or higher. According to this production method, there is obtained short fibrous silica having an average diameter (D) of 10 to 30 nm, a length (L) of 30 to 100 nm, and an aspect ratio (L/D) of 3 to 10 (see PATENT LITERATURE 1 and 2).

Also, as a production method of irregular silica particles with a silicic acid solution as a raw material, the following method has been proposed (PATENT LITERATURE 3). In this method, a silicic acid solution having a pH of 1.0 to 7.0 and a silica concentration of 0.05 to 3.0% by mass is aged at 1 to 98° C. to prepare a polymerized silicic acid solution having a silicic acid solution viscosity of 0.9 to 100 mPa·s. Furthermore, the prepared polymerized silicic acid solution is added with alkali and heated to prepare a seed solution. The obtained seed solution is built up.

CITATION LIST

Patent Literature

PATENT LITERATURE 1: JP-A-11-061043
PATENT LITERATURE 2: JP-A-2003-133267
PATENT LITERATURE 3: JP-A-2013-032276

SUMMARY OF INVENTION

Problems to be Solved by Invention

However, in the production methods of PATENT LITERATURES 1 and 2, a dispersion having a solid content concentration of as low as 0.1 to 5% by mass needs to be hydrothermally treated at a high temperature of 250° C. or higher. Therefore, there are problems in that production efficiency is poor, and production cost is high. Also, when a dispersion having a high silica concentration is hydrothermally treated by the methods of PATENT LITERATURES 1 and 2, silica particles are gelled, failing to obtain desired chain particles.

Also, in the production method of PATENT LITERATURE 3, which uses a silicic acid solution as a raw material, highly pure silica particles are unlikely to be obtained.

Under such circumstances, there is need for a method of efficiently producing highly pure and highly concentrated chain silica particles.

Solution to Problems

According to the production method of a chain particle dispersion of the present invention, a highly pure silica particle dispersion is adjusted so as to have a specific ammonia concentration and silica concentration, and hydrothermally treated at a specific temperature. Accordingly, a highly pure and highly concentrated chain particle dispersion can be efficiently produced.

This production method includes the following steps.

(1) Dispersion preparation step: hydrolyzing alkoxysilane in the presence of ammonia to prepare a dispersion containing highly pure silica particles.

(2) Ammonia removal step: removing the ammonia from this dispersion such that the amount of ammonia relative to silica contained in the dispersion is 0.3% by mass or less.

(3) Hydrothermal treatment step: after the ammonia removal step, hydrothermally treating the dispersion at a temperature of not lower than 150° C. and lower than 250° C. to link silica particles into a chain shape. The silica concentration of the dispersion used in this step is 12% by mass or more.

The dispersion according to the present invention includes chain particles having an average linked number of silica particles (primary particles) of 7 or more. An abrasive including such chain silica particles is high in polishing rate and excellent in polishing properties.

BRIEF DESCRIPTION OF DRAWINGS

FIG. 1 is an electron micrograph illustrating appearances of chain particles.

DESCRIPTION OF EMBODIMENTS

The production method of a chain particle dispersion according to the present invention will be described. First, alkoxysilane is hydrolyzed in the presence of ammonia to prepare a dispersion containing highly pure silica particles (dispersion preparation step). Thereafter, the ammonia is removed from this dispersion such that the amount of ammonia relative to silica contained in the dispersion is 0.3% by mass or less (ammonia removal step). Thereafter, this dispersion is hydrothermally treated at a temperature of not lower than 150° C. and lower than 250° C., in a state in which the silica concentration is 12% by mass or more (hydrothermal treatment step).

In this manner, even in a highly concentrated silica particle dispersion having a silica concentration of 12% by mass or more, highly pure chain particles can be efficiently produced without causing gelation, due to the ammonia removal treatment and the hydrothermal treatment at a specific temperature. As described herein, particles each having two or more primary particles (silica particles) linked together are referred to as chain particles. According to the present invention, chain particles having a high linked number are more likely to be obtained than the known production methods. The linked shape of the chain particles may be linear, bent, or branched. FIG. 1 is a photograph obtained by taking a picture of the chain particles through a scanning electron microscope. For optional 100 particles, the linked number (the number of linked primary particles) was checked through a scanning electron microscope. An average value thereof was defined as an average linked number.

When an abrasive is prepared with such chain particles, a polishing rate tends to be faster as an average linked number is higher. Therefore, the average linked number is preferably 7 or more, further preferably 10 or more. The upper limit of the average linked number is not particularly limited, as long as the chain particles are maintained in the state of being dispersed in a solution. The upper limit depends on the particle size of primary particles, but is, for example, about 30.

Also, the ratio of chain particles each having (average linked number±1) linked primary particles in the dispersion is preferably 50% or more. This ratio is reflected by the distribution of the linked number. The higher this rate, the more uniform the linked number. Therefore, more homogeneous polishing is enabled. This ratio is preferably as high as possible, such as 70% or more, 80% or more, 90% or more, and 100%.

Here, not all primary particles in the dispersion necessarily form chain particles. Unlinked primary particles may individually exist. However, the polishing rate tends to be faster as the ratio of chain particles is higher. Therefore, the ratio of chain particles is preferably as high as possible, such as 70% or more, 90% or more, and 100%.

It is noted that other various steps may be included between any two of the dispersion preparation step, ammonia removal step, and hydrothermal treatment step. For example, the dispersion used in the hydrothermal treatment step may be not only a dispersion immediately after the ammonia removal step, but also a dispersion obtained through another step after the ammonia removal step.

Here, the silica concentration of the silica particle dispersion during the hydrothermal treatment needs to be 12% by mass or more. The adjustment of the silica concentration to 12% by mass or more may be performed in the dispersion preparation step, in the ammonia removal step, during the hydrothermal treatment, or in another step before the hydrothermal treatment step. It is preferable that the silica concentration reach 12% by mass or more before the hydrothermal treatment step.

Hereinafter, each step will be described in detail.

[Dispersion Preparation Step]

Here, alkoxysilane as a raw material is hydrolyzed in the presence of ammonia to form silica particles and prepare a dispersion containing the silica particles. The alkoxysilane may be of one type, or of two or more types. Also, an alkoxysilane having a short alkyl chain, such as tetramethoxysilane (TMOS) and tetraethoxysilane (TEOS), is preferable. This is because a hydrolysis rate is high, densification is likely to proceed, and silica particles having a small carbon content tend to be obtained.

There are two examples of the preparation method of a silica particle dispersion through the hydrolysis of alkoxysilane.

(Method I) A method of adding a mixed solution of alkoxysilane and an organic solvent to a pre-prepared solution containing water, an organic solvent, and a catalyst (ammonia).

(Method II) A method of simultaneously adding solution A containing alkoxysilane and solution B containing a catalyst and water to a solution substantially consisting of an organic solvent. Here, solution A may contain an organic solvent. The phrase "substantially consisting of an organic solvent" indicates that impurities or the like inevitably contained during the production process of the organic solvent are contained, but other substances are not contained. That is, for example, the content of the organic solvent is 99% by mass or more, preferably 99.5% by mass or more.

It is noted that both methods I and II can also adopt a so-called seed method. In this seed method, to perform hydrolysis, alkoxysilane is added to seed particles previously prepared in a pre-prepared solution.

The hydrolysis of alkoxysilane is usually performed under normal pressure at a temperature of not higher than the boiling point of a used solvent.

The silica particles (primary particles) obtained in this step preferably have an average particle size of 5 to 300 nm. When the average particle size is less than 5 nm, the silica particle dispersion tends to have insufficient stability. Furthermore, since the particle size is excessively small, there is a risk that a sufficient polishing rate as an abrasive may not be obtained. When the average particle size is more than 300 nm, the linking among particles is unlikely to proceed. Therefore, there is a risk that desired chain particles may not be obtained. The average particle size is preferably 5 to 100 nm.

Also, such silica particles preferably have a truly spherical shape with an aspect ratio of 1.00 to 1.20, and the coefficient of variance (CV value) of particles is preferably 30% or less. With such silica particles, the linked number of produced chain particles is easily controlled. The coefficient of variance is more preferably 20% or less, further preferably 10% or less.

Examples of the organic solvent may include alcohols, ketones, ethers, and esters. More specific examples may include alcohols such as methanol, ethanol, propanol, and butanol, ketones such as methyl ethyl ketone and methyl isobutyl ketone, glycol ethers such as methyl Cellosolve, ethyl Cellosolve, and propylene glycol monopropyl ether, glycols such as ethylene glycol, propylene glycol, and hexylene glycol, and esters such as methyl acetate, ethyl acetate, methyl lactate, and ethyl lactate. Among these, methanol or ethanol is more preferable, and methanol is particularly preferable. One of these organic solvents may be singly used, or a mixture of two or more thereof may be used.

The added amount of a catalyst used for hydrolysis is preferably 0.005 to 1 mol per 1 mol of alkoxysilane. When less than 0.005 mol, hydrolysis is unlikely to be caused, and thus there is a risk that the particle size distribution may be broad. When more than 1 mol, hydrolysis proceeds significantly fast, and thus there is a risk that particles are unlikely to be formed, and a gelled product may be formed. The added amount of the catalyst is preferably 0.01 to 0.8 mol per 1 mol of alkoxysilane.

The amount of water used for hydrolysis, per 1 mol of Si—OR groups constituting alkoxysilane, is preferably 0.5 to 10 mol, more preferably 1 to 5 mol.

[Ammonia Removal Step]

In this step, the ammonia is removed from the dispersion such that the amount of ammonia relative to silica (hereinafter, merely referred to as the ammonia amount in relation to the present invention) contained in the dispersion is 0.3% by mass or less. This is an important step to reduce ammonia to a prescribed amount or less before the hydrothermal treatment step.

For example, in the above-described PATENT LITERATURES 1 and 2, it is a necessary condition that the ammonia concentration of the dispersion is 50 to 400 ppm before the hydrothermal treatment (paragraph 0030 of PATENT LITERATURE 1). On the other hand, the ammonia is reduced as low as possible in the present invention. Accordingly, the silica particle dispersion can be prevented from being gelled during the hydrothermal treatment. In an example of PATENT LITERATURE 1, the ammonia concentration (excluding ammonia contained in particles) of the silica particle dispersion (silica concentration 1% by mass) measured by an ion electrode is 83 ppm. That is, the ammonia amount relative to silica is 0.83% by mass. Although the ammonia amount contained in particles is not considered in PATENT LITERATURES 1 and 2, it is considered in the present invention. That is, in the present invention, the ammonia amount in the dispersion includes the ammonia amount contained in the silica particles.

In the present invention, the hydrothermal treatment is performed in a state in which the ammonia amount is 0.3% by mass or less. Accordingly, a stable dispersion of chain particles is obtained. It is considered that this is because an appropriate amount of soluble silica is generated in the hydrothermal treatment step, and thus there are formed chain particles each having such a linked number that allows for maintaining stability. Therefore, the removal is preferably performed such that the ammonia amount reaches 0.1% by mass or less. The ammonia amount is more preferably 0.08% by mass or less, further preferably 0.06% by mass or less. The lower limit of the ammonia amount is preferably 0.01% by mass, more preferably 0.02% by mass, in order to form chain particles having a desired linked number through the hydrothermal treatment as described above.

A removal method is not particularly limited, as long as the ammonia amount can be reduced to a prescribed value. It is noted that during hydrolysis, ammonia exists in a state of being incorporated into particles. Therefore, for achieving an ammonia amount of 0.3% by mass or less, ammonia existing not only in the liquid phase but also inside the particles needs to be removed. This ammonia inside the particles is hardly removed in a known ultrafiltration membrane treatment or the like. Therefore, a method of discharging ammonia from the silica particles to outside the particles (into the dispersion) is preferable.

For example, through a heat treatment, a decompression treatment, and the like, ammonia can be discharged into the liquid phase of the dispersion. At the same time, ammonia adsorbed to the surface of particles, which is unlikely to be removed through an ultrafiltration treatment or the like, can also be diffused into the liquid phase of the dispersion. Specifically, ammonia is removed from the liquid phase with an ultrafiltration membrane, ion exchange resin, or the like, and thereafter ammonia remaining inside particles is discharged into the liquid phase of the dispersion by at least one of a heat treatment and a decompression treatment. The ammonia discharged into the liquid phase is removed with an ultrafiltration membrane, ion exchange resin, or the like.

It is noted that in this step, the organic solvent in the solvent of the silica particle dispersion can be replaced with water (pure water) simultaneously with the removal of ammonia. Obviously, a water replacement step may be independently included.

[Hydrothermal Treatment Step]

In this step, the dispersion of silica particles, in which ammonia has been removed, is hydrothermally treated at not lower than 150° C. and lower than 250° C. Through this hydrothermal treatment, the silica particles (primary particles) are linked. When the hydrothermal treatment temperature is lower than 150° C., linking among primary particles does not sufficiently proceed, and chain particles are not obtained. On the other hand, when 250° C. or higher, linking among primary particles proceeds, but excessively proceeds to an uncontrollable level, with the result that uniform chain particles are unlikely to be obtained. Furthermore, the dispersion is gelled in some cases. The hydrothermal treatment temperature is preferably 170 to 230° C., more preferably 180 to 220° C. The average particle size of primary particles constituting chain particles is substantially the same as the average particle size of the silica particles in the dispersion obtained in the dispersion preparation step.

The hydrothermal treatment needs to be performed to a dispersion having a silica concentration of 12% by mass or more. Therefore, when the silica concentration of the dispersion is less than 12% by mass after the ammonia removal step, the silica concentration is adjusted so as to be 12% by mass or more during the hydrothermal treatment (silica concentration adjustment step). For example, the silica concentration is adjusted to 12% by mass or more before the hydrothermal treatment step. When less than 12% by mass, desired chain particles are not obtained even if the ammonia amount and the hydrothermal treatment condition are optimized. The silica concentration of a dispersion to be subjected to the hydrothermal treatment is preferably 15% by mass or more, more preferably 20% by mass or more. The upper limit thereof is not particularly limited, and no problem is caused with, for example, 40% by mass.

The pressure during the hydrothermal treatment is usually a saturation pressure at each treatment temperature. However, further pressure may be added as long as the linking among particles can be controlled.

The time of the hydrothermal treatment is not particularly limited, as long as the linking among particles can be controlled. However, when the treatment time is excessively short, the linking among particles does not sufficiently proceed, and thus there is a risk that chain particles are not obtained. Even if chain particles are obtained, the linking among particles is difficult to control. When the treatment time is excessively long, the linking among particles proceeds, but excessively proceeds to an uncontrollable level, with the result that desired uniform chain particles are unlikely to be obtained. Also, there is a risk that the dispersion may be gelled. Therefore, the treatment time is, for example, preferably 1 to 24 hours, more preferably 3 to 15 hours, although it depends on the temperature and pressure during the hydrothermal treatment.

Furthermore, since alkoxysilane is not added during the hydrothermal treatment, an unreacted product is not generated. Also, since the hydrothermal treatment is performed at a temperature lower than known technologies, dissolution of silica from particles can be suppressed. This can suppress, for example, residues such as small particles and oligomer components due to self-nucleation. Therefore, the produced chain particle dispersion contains a small amount of an unreacted product.

Also, the ammonia amount in the chain particle dispersion obtained in this step is substantially the same as the above-described ammonia amount after the ammonia removal step. That is, the ammonia amount does not particularly change during the above-described silica concentration adjustment step and hydrothermal treatment step.

It is noted that the chain particle dispersion according to the present invention does not lose its stability even if ammonia is added, as long as it is after the hydrothermal treatment. For example, ammonia can be added as necessary, such as for processing to an abrasive. That is, the ammonia amount relative to silica in the dispersion may exceed 0.3% by mass.

Also, the silica concentration of the chain particle dispersion obtained in this step is 12% by mass or more. That is, the silica concentration does not particularly change before and after the hydrothermal treatment, except where the dispersion is intentionally concentrated or diluted during the hydrothermal treatment step.

Incidentally, water, ammonia, or the like may be added to the chain particle dispersion as necessary, as long as it is after the hydrothermal treatment. That is, the silica concentration may become less than 12% by mass. On the other hand, the dispersion may be further concentrated within a scope that does not impair stability.

Through the above-described steps, chain particles having an average linked number of primary particles of 7 or more are likely to be obtained. Also, bent chain particles are likely to be obtained. Therefore, an abrasive including such chain particles has a high polishing rate. Also, when the chain particles are used as primary particles for forming porous powder, the pore volume of porous dry powder can be increased.

Furthermore, this chain particle dispersion contains a small amount of an unreacted product. The content of an unreacted product in the dispersion is preferably 200 ppm or less. When the amount of an unreacted product is small, a substance adhering to a substrate decreases when the dispersion is used in an abrasive. Also, various chemical agents added to an abrasive are prevented from adsorbing and reacting. Therefore, the effects of the chemical agents can be effectively exerted. The content of an unreacted product is preferably 150 ppm or less.

This unreacted product indicates a "compound containing silicon", other than silica particles, present in the dispersion. This "compound containing silicon" encompasses a compound of which the reaction has not proceeded until intended silica particles are formed. Examples of this compound may include an unreacted raw material alkoxysilane and a low-molecular hydrolysate (oligomer) thereof.

EXAMPLES

Hereinafter, examples of the present invention will be specifically described.

Example 1

<Production of Chain Silica Particle Dispersion>

Firstly, 532.5 g of tetraethoxysilane (Ethyl Silicate 28 manufactured by Tama Chemicals Co., Ltd., 28% by mass as $SiO_2$) is dissolved in 2450 g of a mixed solvent of water and methanol (water/methanol mass ratio 2/8) to prepare a mixed solution. While a mixed solvent of 139.1 g of pure water and 169.9 g of methanol was maintained at 60° C., 2982.5 g of the above-described mixed solution and 596.4 g of ammonia water having a concentration of 0.25% by mass were simultaneously added to the mixed solvent over 20 hours. After the addition ended, aging for 3 hours was performed at this temperature. Thereafter, unreacted tetraethoxysilane, methanol, and ammonia were removed through an ultrafiltration membrane.

Next, pure water was added for temporary dilution, and the diluted solution was concentrated under reduced pressure using a rotary evaporator. Accordingly, the ammonia content remaining inside particles was removed to obtain a 20% by mass aqueous dispersion of silica particles. The amount of ammonia relative to silica was 0.05% by mass (ammonia concentration in the dispersion including the inside of particles: 100 ppm).

Thereafter, a hydrothermal treatment was performed for 10 hours in an autoclave at 200° C. to obtain a dispersion that contains chain silica particles and that has a solid content concentration of 20% by mass. FIG. 1 is an electron micrograph of the chain particles obtained in this example. Table 1 illustrates the treatment conditions of each step, the properties of silica particles or a dispersion, and the properties of produced chain silica particles. The individual properties were measured in the following methods.

(1) Average Particle Size of Silica Particles (Primary Particles)

An electron micrograph of the silica particles was taken. For each of optional 100 particles, an area was calculated, and a circle-equivalent diameter was calculated from the calculated area. An average value of the circle-equivalent diameter was defined as an average particle size of the silica particles.

(2) Aspect Ratio of Silica Particles (Primary Particles)

The particles are observed through a scanning electron microscope. Here, a long side of a rectangle surrounding one particle in such a manner as to contact this particle is defined as b, and a short side thereof is defined as a. A ratio between short side a and long side b (b/a; provided that b≥a) was measured for 100 particles, and an average value thereof was defined as an aspect ratio.

(3) Coefficient of Variance (CV Value) of Silica Particles (Primary Particles)

A coefficient of variance is represented by "(standard deviation/average particle size)×100". This is calculated based on the measurement method of the average particle size of the silica particles.

(4) Average Linked Number of Silica Particles The particles were observed through a scanning electron microscope, and a linked number (the number of linked primary particles) was checked for 100 particles. An average value thereof was defined as an average linked number of the silica particles. When an unlinked primary particle was observed, the linked number thereof was determined to be 1.

(5) Linked Particle Ratio of Silica Particles

The particles were observed through a scanning electron microscope, and a linked number was checked for 100 particles. The ratio of particles (chain particles) having two or more linked primary particles was calculated.

(6) Silica Concentration

Five grams of a sample of the dispersion was dried at 150° C. for 1 hour. Based on masses before and after drying, a silica concentration was calculated.

(7) Ammonia Amount in Dispersion To the dispersion, a 20% by mass NaOH aqueous solution was added, and distilled while dissolving silica particles. The recovered ammonia was trapped with 0.05 mol/L sulfuric acid, and titrated with 0.1 N NaOH. The amount of consumed sulfuric acid was calculated to calculate the amount of all ammonia contained in the dispersion.

(8) Amount of Unreacted Product in Dispersion Using a CS150GXL micro ultracentrifuge manufactured by Hitachi Koki Co., Ltd., the dispersion was centrifuged at 1,370,000 rpm (1,000,000 G) at a set temperature of 10° C. for 30 minutes. A "compound containing silicon" (unreacted product), other than silica particles, present in the supernatant of this treatment solution was measured as Si by an ICPS-8100 ICP emission analyzer manufactured by Shimadzu Corporation. This measured value was converted into the $SiO_2$ concentration in the dispersion.

<Production of Abrasive>

Into 500 g of the chain silica particle dispersion, 333 g of hydrogen peroxide water having a concentration of 30% by mass, 5 g of ammonium oxalate, and 162 g of water were mixed. Thus, there was prepared an abrasive having a silica concentration of 10% by mass and containing 10% by mass of a hydrogen peroxide and 0.5% by mass of ammonium oxalate. This abrasive was subjected to a polishing test.

(9) Polishing Test

A substrate for polishing was set to a polishing device (NF300 manufactured by Nano Factor Inc.). With a substrate load of 5 psi, a table rotation speed of 50 rpm, and a spindle speed of 60 rpm, polishing was performed using the abrasive at a rate of 60 ml/min until a sacrifice layer (thickness 0.2 μm) on an insulating film disappeared. At this time, the polishing time was 92 seconds. The polishing rate is illustrated in Table 1.

The used substrate for polishing is as follows. On a silicon wafer (8 inch wafer) substrate, in which an insulating film (thickness 0.2 μm) containing silicon nitride, an insulating film (thickness 0.4 μm) containing silica, and an insulating film (thickness 0.2 μm) containing silicon nitride are sequentially laminated, a positive-type photoresist was applied, and exposed to light with a line and space of 0.3 μm. Next, the exposed portion was removed with a developer of tetramethyl ammonium hydride (TMAH). Next, a pattern was formed on the insulating film of the lower layer using a mixed gas of $CF_4$ and $CHF_3$. Thereafter, the resist was removed by $O_2$ plasma. Thus, a wiring groove having a width (WC) of 0.3 μm and a depth of 0.6 m was formed. On the substrate on which this wiring groove was formed, a copper (Cu) thin layer was film-formed by a CDV method. Furthermore, a copper film was formed by an electric field plating method such that the copper layer (sacrifice layer) on the insulating film had a thickness of 0.2 μm in total. Thus, a substrate for polishing was formed.

In Examples and Comparative Examples below, individual properties were evaluated in the same manner as Example 1.

Example 2

A chain particle dispersion was produced in the same manner as Example 1, except that the ammonia amount relative to silica before the hydrothermal treatment was changed to 0.08% by mass.

Example 3

A chain particle dispersion was produced in the same manner as Example 1, except that the ammonia amount relative to silica before the hydrothermal treatment was changed to 0.1% by mass.

Example 4

A chain particle dispersion was produced in the same manner as Example 1, except that the ammonia amount relative to silica before the hydrothermal treatment was changed to 0.3% by mass.

Example 5

A chain particle dispersion was produced in the same manner as Example 1, except that the hydrothermal treatment temperature was changed to 150° C.

Example 6

A chain particle dispersion was produced by performing the same process as Example 1 until the hydrothermal treatment, except that the silica concentration of the dispersion during the hydrothermal treatment was changed to 12% by mass, and thereafter concentrating the dispersion to 20% by mass.

Example 7

A chain particle dispersion was produced in the same manner as Example 1, except that the ammonia amount relative to silica before the hydrothermal treatment was changed to 0.03% by mass.

Example 8

The same process as Example 1 was performed until the hydrothermal treatment, except that the silica concentration of the dispersion during the hydrothermal treatment was changed to 15% by mass. Thereafter, the dispersion was concentrated to produce a 20% by mass chain particle dispersion.

Example 9

A chain particle dispersion having a silica concentration of 40% by mass was produced in the same manner as Example 1, except that the silica concentration of the dispersion during the hydrothermal treatment was changed to 40% by mass. Also, an abrasive was prepared in the same manner as Example 1, except that 250 g of this chain particle dispersion was used.

Example 10

A chain particle dispersion was produced in the same manner as Example 1, except that the hydrothermal treatment temperature was changed to 170° C.

Example 11

A chain particle dispersion was produced in the same manner as Example 1, except that the hydrothermal treatment temperature was changed to 180° C.

Example 12

A chain particle dispersion was produced in the same manner as Example 1, except that the hydrothermal treatment temperature was changed to 220° C.

Example 13

A chain particle dispersion was produced in the same manner as Example 1, except that the hydrothermal treatment temperature was changed to 230° C.

Example 14

A chain particle dispersion was produced in the same manner as Example 1, except that the hydrothermal treatment temperature was changed to 245° C.

Example 15

A chain particle dispersion was produced in the same manner as Example 1, except that the hydrothermal treatment time was changed to 1 hour.

Example 16

A chain particle dispersion was produced in the same manner as Example 1, except that the hydrothermal treatment time was changed to 3 hours.

Example 17

A chain particle dispersion was produced in the same manner as Example 1, except that the hydrothermal treatment time was changed to 15 hours.

Example 18

A chain particle dispersion was produced in the same manner as Example 1, except that the hydrothermal treatment time was changed to 24 hours.

Comparative Example 1

A chain particle dispersion was produced in the same manner as Example 1, except that the dispersion was not concentrated under reduced pressure before the hydrothermal treatment, the ammonia amount relative to silica was 0.90% by mass, the silica concentration of the dispersion was 1% by mass, and the hydrothermal treatment temperature was 300° C.

Comparative Example 2

A dispersion was produced in the same manner as Comparative Example 1, except that the ammonia amount relative to silica was 1.5% by mass, and the hydrothermal treatment temperature was 200° C. The silica particles in the obtained dispersion were spherical.

Comparative Example 3

A dispersion was produced in the same manner as Example 1, except that the dispersion was not concentrated under reduced pressure before the hydrothermal treatment, and the ammonia amount relative to silica was 0.90% by mass. Since this dispersion was gelled, the evaluation of an abrasive was not performed.

Comparative Example 4

A dispersion was produced in the same manner as Example 1, except that the hydrothermal treatment temperature was 250° C. Since this dispersion was gelled, the evaluation of an abrasive was not performed.

Comparative Example 5

A dispersion was produced by performing the same process as Example 1 until the hydrothermal treatment, except that the silica concentration of the dispersion during the hydrothermal treatment was changed to 10% by mass, and thereafter concentrating the dispersion to 20% by mass. The silica particles in the obtained dispersion were spherical.

TABLE 1

| | Particle formation step | | | Ammonia removal step | | | Hydrothermal treatment step | | |
|---|---|---|---|---|---|---|---|---|---|
| | Primary particles | | | | | Ammonia/ silica ratio mass % | Silica concentration mass % | Temperature ° C. | Time hour |
| | Average particle size mm | Aspect ratio | CV value % | Step performed | Ammonia/ concentration | | | | |
| Example 1 | 20 | 1.05 | 7 | Yes | 100 | 0.05 | 20 | 200 | 10 |
| Example 2 | 20 | 1.05 | 7 | Yes | 160 | 0.08 | 20 | 200 | 10 |
| Example 3 | 20 | 1.05 | 7 | Yes | 200 | 0.1 | 20 | 200 | 10 |
| Example 4 | 20 | 1.05 | 7 | Yes | 600 | 0.3 | 20 | 200 | 10 |
| Example 5 | 20 | 1.05 | 7 | Yes | 100 | 0.05 | 20 | 150 | 10 |
| Example 6 | 20 | 1.05 | 7 | Yes | 60 | 0.05 | 12 | 200 | 10 |
| Example 7 | 20 | 1.05 | 7 | Yes | 60 | 0.03 | 20 | 200 | 10 |
| Example 8 | 20 | 1.05 | 7 | Yes | 100 | 0.05 | 15 | 200 | 10 |
| Example 9 | 20 | 1.05 | 7 | Yes | 100 | 0.05 | 40 | 200 | 10 |
| Example 10 | 20 | 1.05 | 7 | Yes | 100 | 0.05 | 20 | 170 | 10 |
| Example 11 | 20 | 1.05 | 7 | Yes | 100 | 0.05 | 20 | 180 | 10 |
| Example 12 | 20 | 1.05 | 7 | Yes | 100 | 0.05 | 20 | 220 | 10 |

TABLE 1-continued

| | | | | | | | | | |
|---|---|---|---|---|---|---|---|---|---|
| Example 13 | 20 | 1.05 | 7 | Yes | 100 | 0.05 | 20 | 230 | 10 |
| Example 14 | 20 | 1.05 | 7 | Yes | 100 | 0.05 | 20 | 245 | 10 |
| Example 15 | 20 | 1.05 | 7 | Yes | 100 | 0.05 | 20 | 200 | 1 |
| Example 16 | 20 | 1.05 | 7 | Yes | 100 | 0.05 | 20 | 200 | 3 |
| Example 17 | 20 | 1.05 | 7 | Yes | 100 | 0.05 | 20 | 200 | 15 |
| Example 18 | 20 | 1.05 | 7 | Yes | 100 | 0.05 | 20 | 200 | 24 |
| Comparative Example 1 | 20 | 1.05 | 7 | No | 90 | 0.9 | 1 | 300 | 10 |
| Comparative Example 2 | 20 | 1.05 | 7 | No | 150 | 1.5 | 1 | 200 | 10 |
| Comparative Example 3 | 20 | 1.05 | 7 | No | 1800 | 0.9 | 20 | 200 | — |
| Comparative Example 4 | 20 | 1.05 | 7 | Yes | 100 | 0.05 | 20 | 250 | — |
| Comparative Example 5 | 20 | 1.05 | 7 | Yes | 50 | 0.05 | 10 | 200 | 10 |

| | | Properties of chain particle dispersion | | | | | |
|---|---|---|---|---|---|---|---|
| | Particle shape | Silica concentration mass % | Linked number distribution particles | Average linked number particles | Ratio of chain particles % | Ratio of chain particles of (average linked number ± 1) % | Unreacted product amount ppm | Polishing performance Polishing rate nm/min |

| | Particle shape | Silica conc. mass % | Linked number distribution | Avg linked number | Ratio chain % | Ratio (avg±1) % | Unreacted ppm | Polishing rate nm/min |
|---|---|---|---|---|---|---|---|---|
| Example 1 | Chain | 20 | 2 to 15 | 10 | 100 | 90 | 150 | 130 |
| Example 2 | Chain | 20 | 2 to 15 | 11 | 100 | 80 | 150 | 130 |
| Example 3 | Chain | 20 | 2 to 20 | 12 | 100 | 70 | 150 | 150 |
| Example 4 | Chain | 20 | 2 to 20 | 15 | 100 | 60 | 150 | 150 |
| Example 5 | Chain | 20 | 2 to 10 | 8 | 95 | 60 | 140 | 120 |
| Example 6 | Chain | 20 | 2 to 10 | 8 | 95 | 60 | 180 | 120 |
| Example 7 | Chain | 20 | 2 to 12 | 8 | 100 | 90 | 150 | 120 |
| Example 8 | Chain | 20 | 2 to 15 | 9 | 100 | 70 | 160 | 120 |
| Example 9 | Chain | 40 | 2 to 15 | 11 | 100 | 80 | 140 | 130 |
| Example 10 | Chain | 20 | 2 to 12 | 8 | 100 | 80 | 140 | 120 |
| Example 11 | Chain | 20 | 2 to 15 | 10 | 100 | 90 | 150 | 130 |
| Example 12 | Chain | 20 | 2 to 15 | 10 | 100 | 90 | 150 | 130 |
| Example 13 | Chain | 20 | 2 to 20 | 12 | 100 | 80 | 160 | 150 |
| Example 14 | Chain | 20 | 2 to 20 | 15 | 100 | 70 | 160 | 150 |
| Example 15 | Chain | 20 | 2 to 12 | 8 | 100 | 70 | 140 | 120 |
| Example 16 | Chain | 20 | 2 to 15 | 10 | 100 | 90 | 150 | 130 |
| Example 17 | Chain | 20 | 2 to 15 | 10 | 100 | 90 | 150 | 130 |
| Example 18 | Chain | 20 | 2 to 20 | 12 | 100 | 70 | 150 | 150 |
| Comparative Example 1 | Chain | 1 | 2 to 5 | 3 | 100 | 90 | 300 | 100 |
| Comparative Example 2 | Spherical | 1 | — | — | — | — | 250 | 90 |
| Comparative Example 3 | Gelled | — | — | — | — | — | — | — |
| Comparative Example 4 | Gelled | — | — | — | — | — | — | — |
| Comparative Example 5 | Spherical | 10 | — | — | — | — | 180 | 90 |

What is claimed is:

1. A production method of an abrasive comprising a chain silica particle dispersion, comprising:
a dispersion preparation step of hydrolyzing alkoxysilane in the presence of ammonia and an organic solvent to prepare a dispersion containing obtain silica particles, wherein an added amount of the ammonia used for hydrolysis is 0.005 to 1 mol per 1 mol of alkoxysilane, and an amount of water used for hydrolysis is 0.5 to 10 mol per 1 mol of Si—OR groups constituting alkoxysilane;
an ammonia removal step of removing the ammonia in the dispersion such that an ammonia amount, including an amount of ammonia in the chain silica particles, relative to silica contained in the dispersion is 0.08% by mass or less;
and a hydrothermal treatment step of, after the ammonia removal step, hydrothermally treating the dispersion at not lower than 150° C. and lower than 250° C. in a state in which a silica concentration is 12% by mass or more,
wherein the chain silica particles prepared by the hydrothermal treatment step have an average linked number of 7 or more of silica particles.

2. The production method of an abrasive comprising a chain silica particle dispersion according to claim 1, wherein the ammonia removal step includes removing the ammonia from the dispersion by at least one of a heat treatment and a decompression treatment.

3. The production method of an abrasive comprising a chain silica particle dispersion according to claim 1, wherein
each silica particle in the chain silica particles has an average particle size of 5 to 300 nm.

4. The production method of an abrasive comprising a chain silica particle dispersion according to claim 1, wherein the ammonia removal step removes the ammonia in the dispersion such that the ammonia amount is 0.01% by mass or more and 0.08% by mass or less.

5. The production method of an abrasive comprising a chain silica particle dispersion according to claim 1, wherein primary particles obtained by the dispersion preparation step has an average particle size of 5 to 300 nm, an aspect ratio of 1.00 to 1.20, and coefficient of variance of 30% or less.

\* \* \* \* \*